United States Patent
Nishimura et al.

(10) Patent No.: US 9,837,290 B2
(45) Date of Patent: Dec. 5, 2017

(54) PROCESSING LIQUID NOZZLE

(71) Applicant: Tokyo Electron Limited, Tokyo (JP)

(72) Inventors: Satoshi Nishimura, Kumamoto (JP);
Naoki Imoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 350 days.

(21) Appl. No.: 14/598,298

(22) Filed: Jan. 16, 2015

(65) Prior Publication Data

US 2015/0209814 A1    Jul. 30, 2015

(30) Foreign Application Priority Data

Jan. 24, 2014  (JP) ................... 2014-011739
Jan. 24, 2014  (JP) ................... 2014-011752

(51) Int. Cl.
*B05B 1/14* (2006.01)
*H01L 21/67* (2006.01)
*G03F 7/16* (2006.01)

(52) U.S. Cl.
CPC .... *H01L 21/6708* (2013.01); *H01L 21/67051* (2013.01); *G03F 7/16* (2013.01)

(58) Field of Classification Search
CPC . H01L 21/6708; H01L 21/67051; G03F 7/16; B05B 7/0408; B05B 1/02; B05B 7/08; B05B 7/0062
USPC ................ 239/590, 418, 420, 428, 429, 430
See application file for complete search history.

(56) References Cited

U.S. PATENT DOCUMENTS

| | | | |
|---|---|---|---|
| 5,833,144 A * | 11/1998 | Kinter .................... | B05B 15/00 239/462 |
| 2013/0112628 A1* | 5/2013 | Yoshihara ............. | G03F 7/0022 210/767 |

FOREIGN PATENT DOCUMENTS

| | | |
|---|---|---|
| JP | 2005-197082 A | 7/2005 |
| JP | 2010-174552 A | 8/2010 |
| JP | 2013-058569 A | 3/2013 |
| JP | 2013-085985 | 5/2013 |
| WO | 2013-008708 A | 1/2013 |

* cited by examiner

*Primary Examiner* — Arthur O Hall
*Assistant Examiner* — Adam J Rogers
(74) *Attorney, Agent, or Firm* — Abelman, Frayne & Schwab

(57) ABSTRACT

Disclosed is a processing liquid nozzle that supplies a processing liquid to a substrate. The processing liquid nozzle includes: a hollow nozzle body; a processing liquid flow space formed inside the nozzle body; and a processing liquid flow path configured to connect a processing liquid ejection port formed in a lower portion of the nozzle body and the processing liquid flow space with each other. The processing liquid flow path perforates the nozzle body in a vertical direction. The processing liquid flow path includes a foreign matter collecting space which is formed below an upper end of the processing liquid flow path so as to sediment and collect foreign matters in the processing liquid.

18 Claims, 12 Drawing Sheets

PROCESSING LIQUID NOZZLE

CROSS-REFERENCE TO RELATED APPLICATIONS

This application is based on and claims priority from Japanese Patent Application Nos. 2014-011739 and 2014-011752, filed on Jan. 24, 2014 with the Japan Patent Office, the disclosures of which are incorporated herein in their entireties by reference.

TECHNICAL FIELD

The present disclosure relates to a processing liquid nozzle that supplies a processing liquid to a substrate and a coating processing apparatus including the processing liquid nozzle.

BACKGROUND

For example, in a semiconductor device manufacturing process, a diameter of a semiconductor wafer (hereinafter, referred to as a "wafer") has been recently being enlarged. In addition, thickness reduction of a wafer is requested in a specific process such as, for example, mounting. In addition, when a wafer having a large diameter and a thin thickness is conveyed or polished as it is, distortion or a crack may occur in the wafer. Thus, for example, the wafer is bonded to, for example, a wafer or a glass substrate serving as a support substrate so as to reinforce the wafer.

The bonding of the wafer and the support substrate is performed by interposing glue between the wafer and the support substrate, using, for example, a bonding system disclosed in Japanese Patent Laid-Open Publication No. 2013-58569. The bonding system includes, for example, a coating apparatus configured to coat glue on, for example, a wafer, a heat treatment apparatus configured to heat the wafer coated with the glue, and a bonding apparatus configured to press the wafer and the support substrate with the glue being interposed therebetween.

In the bonding apparatus, when the wafer and the support substrate are compressed, the glue is pressed out from the gap between the wafer and the support substrate. There is a concern that the glue pressed out as such may have an adverse effect on a conveyance process or a processing process of the wafer and the support substrate. For example, when the glue adheres to a conveyance apparatus that conveys the wafer and the support substrate in the conveyance process, the glue may adhere to other wafers or support substrates. In addition, the glue may also adhere to a processing apparatus that performs a predetermined process on the wafer and the support substrate in the processing process. In such a case, the wafer and the support substrate may not be properly bonded to each other. Accordingly, it has been proposed to supply a solvent for glue from a solvent nozzle to the outer circumferential portion of a wafer coated with the glue so as to remove the glue on the outer circumferential portion of the wafer in the coating apparatus.

SUMMARY

The present disclosure provides a processing liquid nozzle that supplies a processing liquid to a substrate. The processing liquid nozzle includes: a hollow nozzle body; a processing liquid flow space formed inside the nozzle body; and a processing liquid flow path configured to connect a processing liquid ejection port formed in a lower portion of the nozzle body and the processing liquid flow space with each other. The processing liquid flow path perforates the nozzle body in a vertical direction. The processing liquid flow path includes a foreign matter collecting space which is formed below an upper end of the processing liquid flow path so as to sediment and collect foreign matters in the processing liquid.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
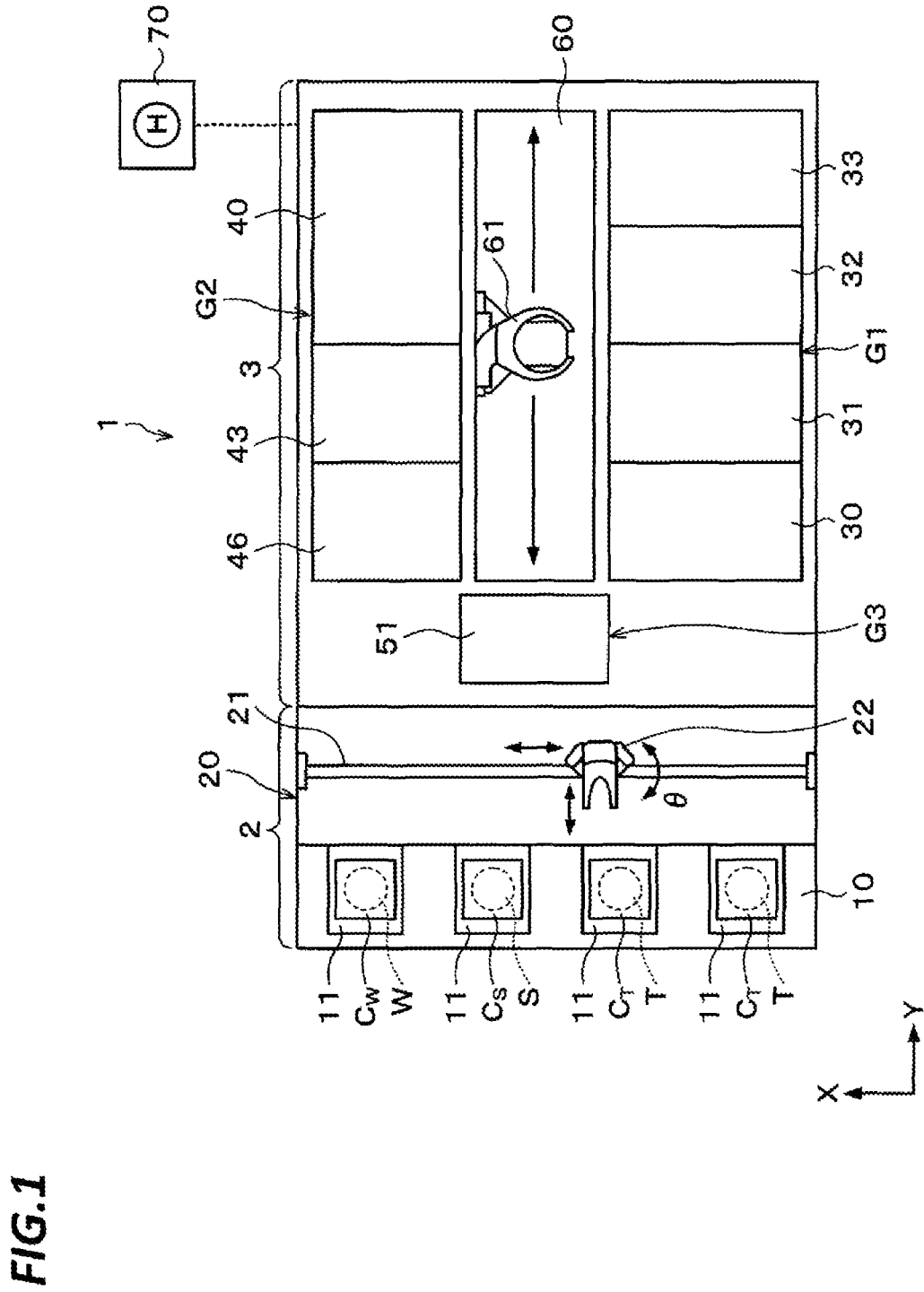
FIG. 1 is a plan view illustrating an outline of a configuration of a bonding system according to an exemplary embodiment.

In the following detailed description, reference is made to the accompanying drawing, which form a part hereof. The illustrative embodiments described in the detailed description, drawing, and claims are not meant to be limiting. Other exemplary embodiments may be utilized, and other changes may be made, without departing from the spirit or scope of the subject matter presented here.

In some cases, foreign matters may be mixed in a solvent and the solvent nozzle disclosed in Japanese Patent Laid-Open Publication No. 2013-58569 may be blocked by the foreign matters. Especially, the problem becomes remarkable when the diameter of the solvent nozzle is small. In such a case, the glue on the outer circumferential portion of the wafer may not be properly removed.

Through an examination, the inventors have found that the foreign matters occur due to various reasons. For example, when a part of the solvent supply pipe connected to the solvent nozzle is peeled off, foreign matters may occur. In addition, when the supply pipe is replaced from the solvent nozzle when periodical maintenance is performed, foreign matters may be mixed in the solvent nozzle. Further, for example, when the seal member provided in the joint between the solvent nozzle and the supply pipe is peeled off, foreign matters may also occur. Thus, it is difficult to specify a foreign matter occurrence source.

The present disclosure has been made in consideration of the problems described above and is to remove foreign matters in a processing liquid so as to suppress blockage of a processing liquid nozzle and to properly supply the processing liquid from the processing liquid nozzle to a substrate.

According to an aspect, the present disclosure provides a processing liquid nozzle that supplies a processing liquid to a substrate. The processing liquid nozzle includes: a hollow nozzle body; a processing liquid flow space formed inside the nozzle body; and a processing liquid flow path configured to connect a processing liquid ejection port formed in a lower portion of the nozzle body and the processing liquid flow space with each other. The processing liquid flow path perforates the nozzle body in a vertical direction. The processing liquid flow path includes a foreign matter collecting space which is formed below an upper end of the processing liquid flow path so as to sediment and collect foreign matters in the processing liquid.

According to another aspect, the present disclosure provides a processing liquid nozzle that supplies a processing liquid to a substrate. The processing liquid nozzle includes: a hollow nozzle body; a processing liquid flow space formed inside the nozzle body; a processing liquid flow path configured to connect a processing liquid ejection port formed in a lower portion of the nozzle body and the processing liquid flow space with each other, in which the processing liquid flow path perforates the nozzle in a vertical direction; a filter provided above the processing liquid flow path so as to collect and remove foreign matters in the processing liquid; and a fixing member configured to fix the filter in the vertical direction in corporation with the nozzle body. The fixing member includes a body configured to fix the filter on a bottom side of the filter, and a protrusion protruding from a top end of the body to be in contact with a ceiling of the processing liquid flow space.

According to still another aspect, the present disclosure provides a processing liquid nozzle that supplies a processing liquid to a substrate. The processing liquid nozzle includes: a hollow nozzle body; a processing liquid flow space formed inside the nozzle body; a processing liquid flow path configured to connect a processing liquid ejection port formed in a lower portion of the nozzle body and the processing liquid flow space with each other, in which the processing liquid flow path perforates the nozzle body in a vertical direction; a filter provided above the processing liquid flow path so as to collect and remove foreign matters in the processing liquid; a fixing member configured to fix the filter in the vertical direction in corporation with the nozzle body, in which the fixing member includes a magnetic material; and a magnet configured to attract the fixing member with the filter being sandwiched therebetween.

According to the present disclosure, foreign matters in a processing liquid may be removed so that blockage of the processing liquid nozzle may be suppressed and the processing liquid may be properly supplied from the processing liquid nozzle to a substrate.

Figure 2:
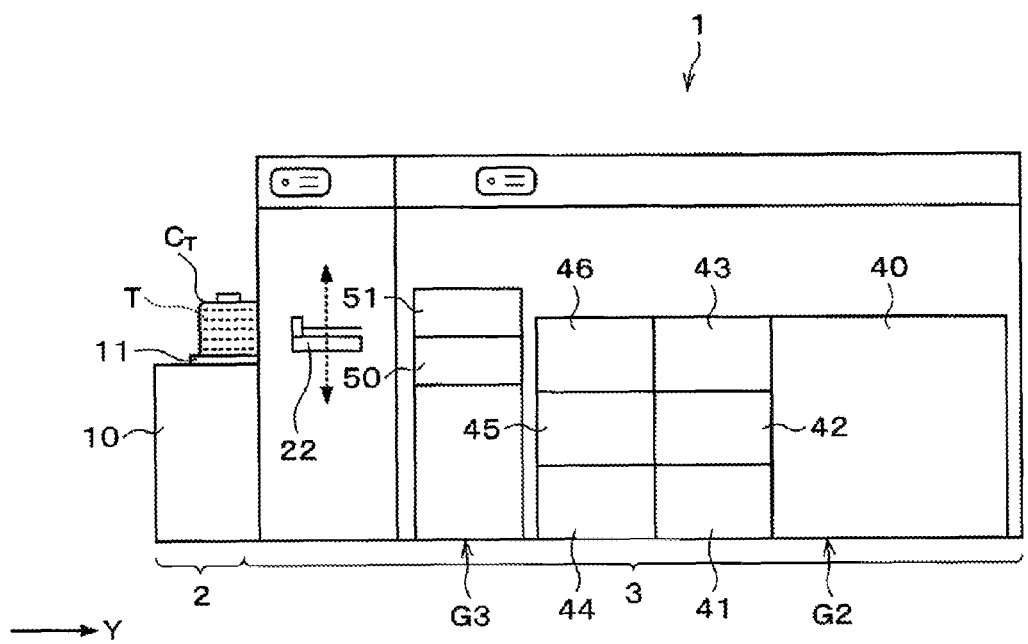
FIG. 2 is a side view illustrating an outline of an inner configuration of the bonding system of the exemplary embodiment of FIG. 1.

Hereinafter, exemplary embodiments of the present disclosure will be described. FIG. 1 is a plan view illustrating an outline of a configuration of a bonding system 1 according to an embodiment. FIG. 2 is a side view illustrating an outline of an internal configuration of the bonding system 1.

Figure 3:
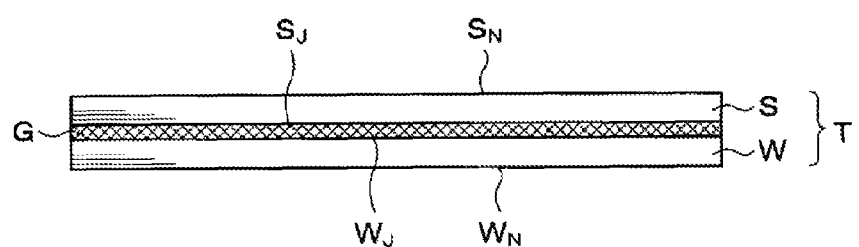
FIG. 3 is a side view illustrating a processing target wafer and a support wafer.

In the bonding system 1, a processing target wafer W as a substrate and a support wafer S as a substrate are bonded to each other through, for example, glue G, as illustrated in FIG. 3. Hereinafter, in the processing target wafer W, a surface which is bonded with the support wafer S through the glue G will be referred to as a "bonded surface" as a front surface, and a surface opposite to the bonded surface $W_J$ will be referred to as a "non-bonded surface $W_N$" as a rear surface. Likewise, in the support wafer S, the surface bonded with the processing target wafer W through the glue G will be referred to as a "bonded surface $S_J$" as a front surface, and the surface opposite to the bonded surface $S_J$ will be referred to as a "non-bonded surface $S_N$" as a rear surface. In addition, in the bonding system 1, the processing target wafer W and the support wafer S are bonded to form a superposed wafer T. The processing target wafer W refers to a wafer which will be a product, in which, for example, a plurality of electronic circuits are formed on the bonded surface $W_J$ and the non-bonded surface $W_N$ is polished. In addition, the support wafer S refers to a wafer which has a diameter which is the same as that of the processing target wafer W and supports the processing target wafer W. In the present exemplary embodiment, descriptions will be made on a case where a wafer is used as the support substrate. However, other substrates such as, for example, a glass substrate, may also be used.

As illustrated in FIG. 1, the bonding system 1 includes a carry-in/out station 2, in which cassettes $C_W$, $C_S$, $C_T$, which accommodate a plurality of processing target wafers W, a plurality of support wafers S, and a plurality of superposed wafers T, respectively, are carried into the carry-in/out station 2 from the outside or carried out from the carry-in/out station 2 to the outside, and a processing station 3 provided with various processing apparatuses to perform predetermined processings on the processing target wafers W, the support wafers S, and the superposed wafers T, respectively, in which the carry-in/out station 2 and the processing station are integrally connected with each other.

A cassette mounting table 10 is installed in the carry-in/out station 2. A plurality of (e.g., four (4)) cassette mounting plates 11 are provided on the cassette mounting table 10. The cassette mounting plates 11 are arranged in a row in an X-direction (in the vertical direction in FIG. 1). When the cassettes $C_W$, $C_S$ and $C_T$ are carried into the cassette mounting plates 11 from the outside of the bonding system 1 or carried out from the cassette mounting plates 11 to the outside of the bonding system 1, the cassettes $C_W$, $C_S$, and $C_T$ may be mounted on the cassette mounting plates 11. In this way, the carry-in/out station 2 is configured to be capable of holding a plurality of processing target wafers W, a plurality of support wafers S, and a plurality of superposed wafers T. The number of cassette mounting plates 11 may be optionally determined without being limited to the present exemplary embodiment. In addition, one cassette may be used for recovering defective wafers. That is, the cassette may be provided so as to separate a wafer having a failure caused in bonding the processing target wafer W and the support wafer S from other normal wafers T. In the present exemplary embodiment, among a plurality of cassettes $C_T$, one cassette $C_T$ is used for recovering defective wafers and other cassettes $C_T$ are used for accommodating normal superposed wafers T.

In the carry-in/out station 2, a wafer conveyance section 20 is provided adjacent to the cassette mounting table 10. In the wafer conveyance section 20, a wafer conveyance apparatus 22 is provided which is movable on a conveyance path 21 which is elongated in the X-direction. The wafer conveyance apparatus 22 is movable in the vertical direction and around a vertical axis (in a θ direction), and is capable of conveying the processing target wafers W, the support wafers S and the superposed wafers T between the cassettes $C_W$, $C_S$ and $C_T$ on the respective cassette mounting plates 11 and transition apparatuses 50 and 51 of a third processing block G3 of the processing station 3.

In the processing station 3, a plurality of (e.g., three (3)) processing blocks G1, G2 and G3, each of which includes various processing apparatuses, are installed. For example, a first processing block G1 is provided on the front side of the processing station 3 (the negative side in the X-direction in FIG. 1), and a second processing block G2 is provide on the rear side of the processing station 3 (the positive side in the X-direction in FIG. 1). In addition, a third processing block G3 is provided on the carry-in/out station 2 side of the processing station 3 (the negative side in the Y-direction in FIG. 1).

For example, in the first processing block G1, bonding apparatuses 30 to 33 are arranged side by side in this order from the carry-in/out station 2 side in the Y-direction to bond the processing target wafer W and the support wafer S to each other by pressing the processing target wafer W and the support wafer S with the bonding glue G being interposed therebetween. The number or arrangement of the bonding apparatus 30 to 33 may be optionally set.

Each of the bonding apparatuses 30 to 33 includes a delivery unit (not illustrated) configured to deliver the processing target wafer W, the support wafer S, and the superposed wafer T between the corresponding bonding apparatus and the outside, an inverting unit (not illustrated) configured to reverse the front and rear surfaces of the support wafer S, a bonding unit (not illustrated) configured to bond the processing target wafer W and the support wafer S to each other by pressing the processing target wafer W and the support wafer S with the glue G being interposed therebetween, and a conveyance unit (not illustrated) configured to convey the processing target wafer W, the support wafer S, and the superposed wafer T to the delivery unit, the inverting unit, and the bonding unit.

For example, as illustrated in FIG. 2, in the second processing block G2, a coating processing apparatus 40 configured to coat the glue G on the processing target wafer W and remove the glue G on the outer circumferential portion of the processing target wafer W, heat treatment apparatuses 41 to 43 configured to heat the processing target wafer W coated with the glue G, and heat treatment apparatuses 44 to 46 which are the same as the heat treatment apparatuses 41 to 43 are arranged side by side in this order in a direction towards the carry-in/out station 2 side (the negative side in the Y-axis direction in FIG. 2). The heat treatment apparatuses 41 to 43 and the heat treatment apparatuses 44 to 46 are respectively installed in three stages in these orders from the bottom. In addition, the number or vertical or horizontal arrangement of the heat treatment apparatuses 41 to 46 may be optionally set.

The heat treatment apparatuses 44 to 46 include a heating unit (not illustrated) configured to heat the processing target wafer W, and a temperature adjustment unit (not illustrated) configured to adjust the temperature of the processing target wafer W. The configuration of the coating processing apparatus 40 will be described later.

For example, in the processing block G3, transition apparatuses 50 and 51 for the processing target wafer W, the support wafer S, and the superposed wafer T are installed in two stages in this order from the bottom.

As illustrated in FIG. 1, a wafer conveyance region 60 is formed in a region surrounded by the first to third processing blocks G1 to G3. In the wafer conveyance region 60, for example, a wafer conveyance apparatus 61 is disposed. The pressure within the wafer conveyance region 60 is equal to or higher than the atmospheric pressure, and in the wafer conveyance region 60, so-called atmosphere system conveyance for the processing target wafer W, the support wafer S, and the superposed wafer T is performed.

The wafer conveyance apparatus 61 includes a conveyance arm which is movable, for example, in the vertical direction and horizontal direction (the Y-axis direction and X-axis direction) and around the vertical axis. The wafer conveyance apparatus 61 may move within the wafer conveyance region 60 so as to convey the processing target wafer W, the support wafer S, and the superposed wafer T to a predetermined apparatus within the first processing block G1, the second processing block G2, and the third processing block G3 therearound.

The bonding system 1 described above is provide with a control unit 70, as illustrated in FIG. 1. The control unit 70 is, for example, a computer, and includes a program storage unit (not illustrated). The program storage unit is stored with programs that control the processings which are performed on the processing target wafer W, the support wafer S, and the superposed wafer T in the bonding system 1. In addition, the program storage unit is also stored with programs for controlling operations of a driving system such as, for example, various processing apparatuses as described above so as to implement a bonding process in the bonding system 1. The bonding process will be described later. The programs may be those stored in a computer-readable storage medium such as, for example, a computer-readable hard disc (HD), a flexible disc FD, a compact disc CD, a magnet optical disc (MO), or a memory card, and installed in the control unit 70 from the storage medium H.

Figure 4:
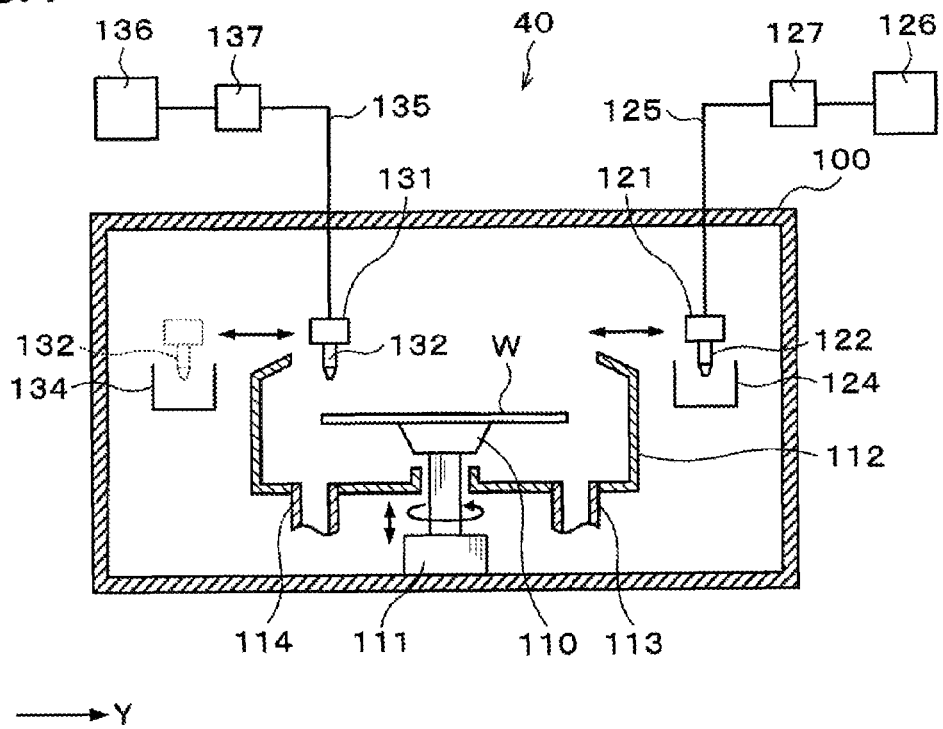
FIG. 4 is a vertical cross-sectional view illustrating an outline of a coating processing apparatus.

Next, a configuration of the coating processing apparatus 40 described above will be described. As illustrated in FIG. 4, the coating processing apparatus 40 includes a processing container 100, of which the inside is sealable. A processing target wafer W carry-in/out port (not illustrated) is formed on the wafer conveyance region 60 side of the processing container 100 and an opening/closing shutter (not illustrated) is provided in the carry-in/out port.

In the central portion of the inside of the processing container 100, a spin chuck 110 is installed which serves as a rotational holding unit that holds and rotates the processing target wafer W. The spin chuck 110 includes a horizontal top surface on which a suction port (not illustrated) is formed to suck, for example, the processing target wafer W. The processing target wafer W may be attracted to and held on the spin chuck 110 by the suction from the suction port.

A chuck driving unit 111 including, for example, a motor, is installed below the spin chuck 110. The spin chuck 110 may be rotated at a predetermined speed by the chuck driving unit 111. In addition, the chuck driving unit 111 is provided with a lifting driving source 111 such as, for example, a cylinder, so that the spin chuck 110 is liftable.

A cup 112 is installed around the spin chuck 110 to receive and recover liquid scattered or dropped from the processing target wafer W. A discharge pipe 113 configured to discharge the recovered liquid and an exhaust pipe 114 configured to evacuate the atmosphere within the cup 112 to a vacuum state are connected to the bottom of the cup 112.

Figure 5:
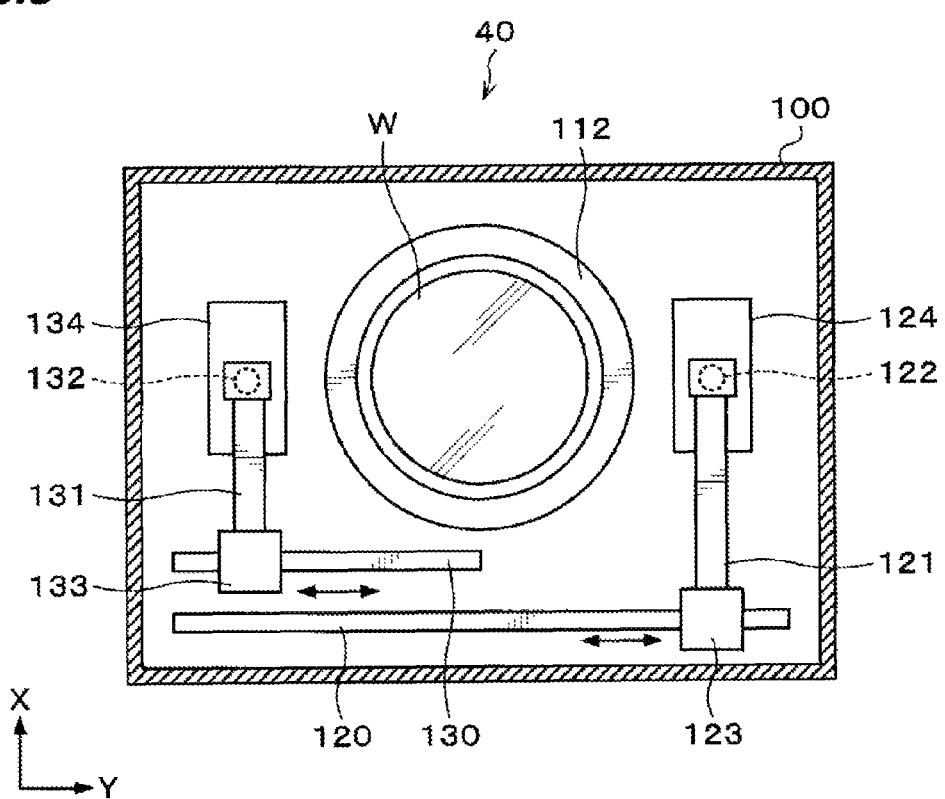
FIG. 5 is a horizontal cross-sectional view illustrating an outline of the coating processing apparatus.

As illustrated in FIG. 5, a rail 120 is formed on the negative side in the X-axis direction (the lower side in FIG. 5) of the cup 112 to be elongated in the Y-axis direction (the left-right direction in FIG. 5). The rail 120 is formed to extend, for example, from the outside of the cup 112 on the negative side in the Y-axis direction (the left side in FIG. 5) to the outside on the positive side in the Y-axis direction (the right side in FIG. 5). An arm 121 is attached to the rail 120.

As illustrated in FIGS. 4 and 5, a glue nozzle 122 is supported on the arm 121 to supply the glue G in the liquid phase to the processing target wafer W. The arm 121 is movable on the rail 120 by a nozzle driving unit 123 illustrated in FIG. 5. As a result, the glue nozzle 122 is movable from a standby unit 124 located outside of the cup 112 in the positive side in the Y-axis direction to a position above the center of the processing target wafer W within the cup 112, and also movable in the radial direction of the processing target wafer W above the processing target wafer W. In addition, the arm 121 is liftable by the nozzle driving unit 123 to adjust the height of the glue nozzle 122.

As illustrated in FIG. 4, a glue supply pipe 125 is connected to the glue nozzle 122 to supply the glue G to the glue nozzle 122. The glue supply pipe 125 communicates with a glue supply source 126 in which the glue G is stored. In addition, a supply device group 127 including, for example, a valve or a flow rate control unit that controls the flow of the glue G, is provided in the glue supply pipe 125.

As illustrated in FIG. 5, a rail 130 is formed between the cup 112 and the rail 120 to be elongated in the Y-axis direction (the left-right direction in FIG. 5). The rail 130 is formed to extend, for example, from the outside of the cup 112 in the negative side in the Y-axis direction (the left side in FIG. 5) to a position adjacent to the center of the cup 112. An arm 131 is attached to the rail 130.

As illustrated in FIGS. 4 and 5, a solvent nozzle 132 serving as a processing liquid nozzle is supported on the arm 131 to supply a solvent of the glue G to the processing target wafer W as a processing liquid. The arm 121 is movable on the rail 130 by a nozzle driving unit 133 illustrated in FIG. 5. As a result, the solvent nozzle 132 is movable from the standby unit 134 provided in the outside of the cup 112 on the negative side in the Y-axis direction to a position above the outer circumferential portion of the processing target wafer W within the cup 112, and also movable in the radial direction of the processing target wafer W above the processing target wafer W. In addition, the arm 131 is liftable by the nozzle driving unit 133 to adjust the height of the solvent nozzle 132.

As illustrated in FIG. 4, a solvent supply pipe 135 serving as a processing liquid supply pipe is connected to the solvent nozzle 132 to supply the solvent of the glue G to the nozzle 132. As described below, the solvent supply pipe 135 is branched into two portions when it is connected to the solvent nozzle 132. In addition, the solvent supply pipe 135 communicates with a solvent supply source 136 which stores the solvent of the glue G therein. In addition, a supply device group 137 including a valve or a flow rate control unit which controls the flow of the solvent of the glue G is provided in the solvent supply pipe 135. As for the solvent of the glue G, for example, an organic thinner may be used.

In the present embodiment, the arm 121 that supports the glue nozzle 122 and the arm 131 that supports the solvent nozzle 132 are attached to separate rails 120 and 130, respectively, but may be attached to the same rail. In addition, the glue nozzle 122 and the solvent nozzle 132 are supported on separate arms 121 and 122, respectively, but may be supported on the same arm.

An operation of each component in the coating processing apparatus 40 are controlled by the control unit 70 described above.

Figure 6:
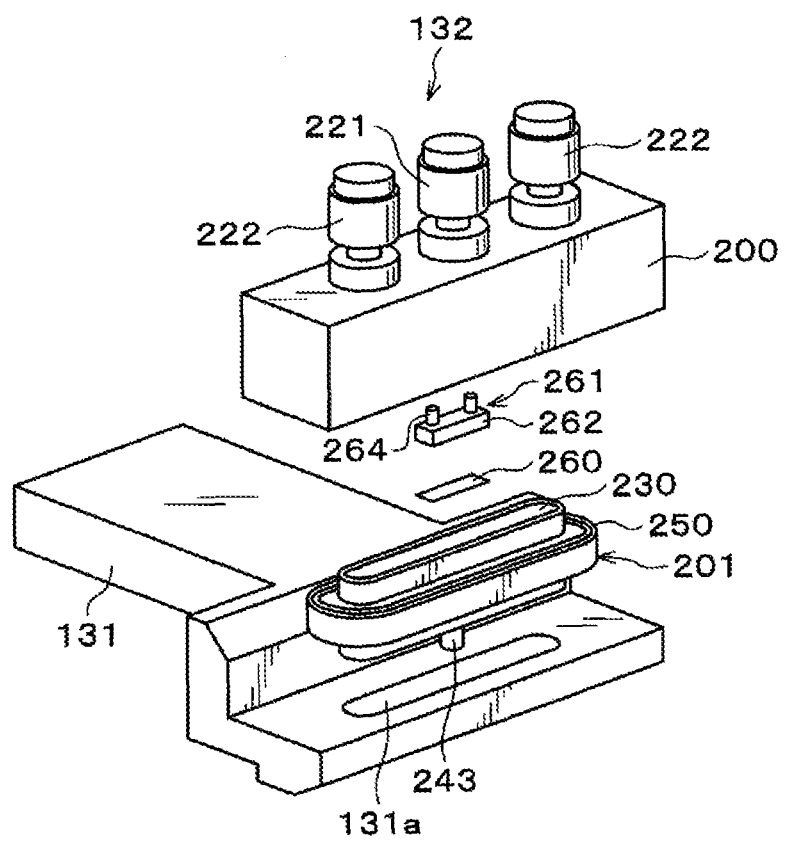
FIG. 6 is a perspective view illustrating an outline of a configuration of a solvent nozzle.
Figure 7:
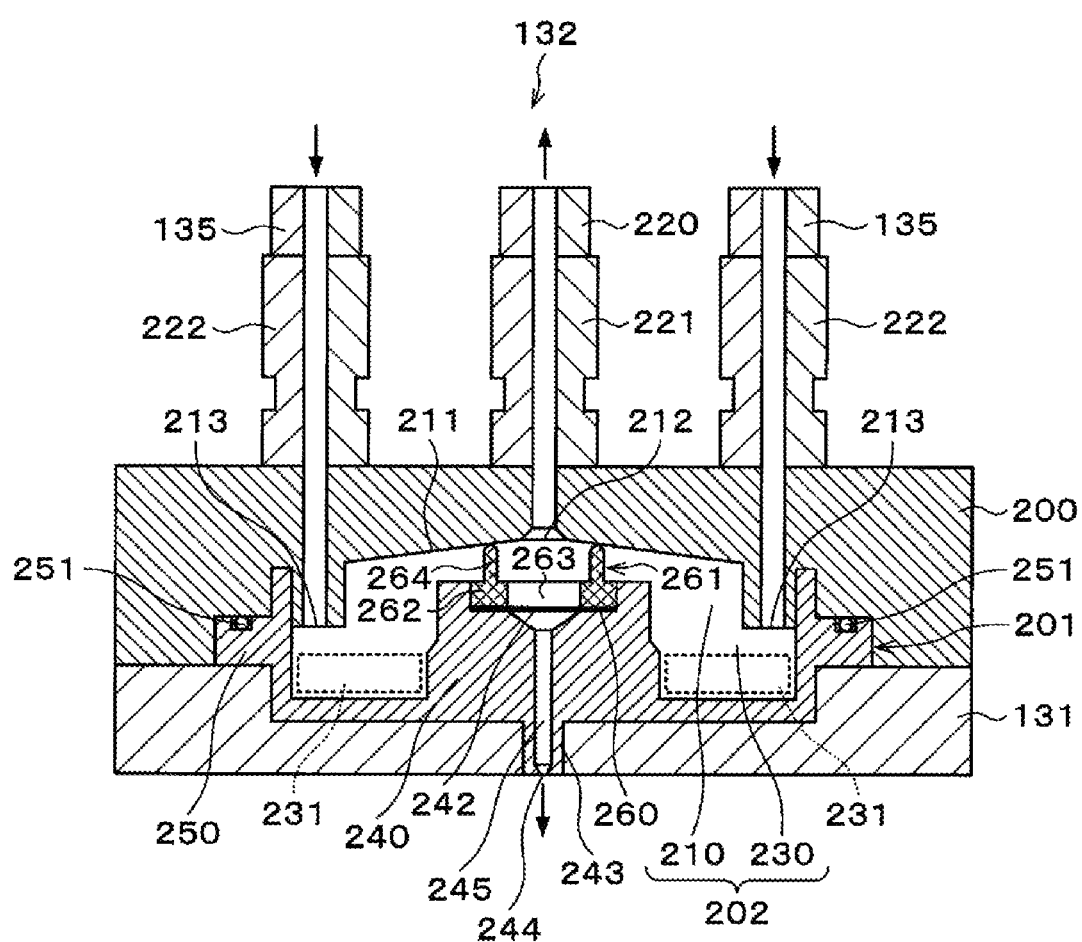
FIG. 7 is a vertical cross-sectional view illustrating an outline of a configuration of the solvent nozzle.

Next, descriptions will be made on a configuration of the solvent nozzle 132 described above. As illustrated in FIGS. 6 and 7, the solvent nozzle 132 includes an upper block 200 and a lower block 201. The lower block 201 is fitted in a recess 131a formed on the arm 131, and the solvent nozzle 132 is supported on the arm 131.

The upper block 200 and the lower block 201 are integrated with each other to form a hollow nozzle body in the present disclosure. A flow space 202 in which the solvent flows is formed in the inside of the nozzle body in which the upper block 200 and the lower block 201 are integrated with each other. The flow space 202 is formed by joining the upper space 210 in the upper block 200 and the lower space 230 in the lower block 201 as described below.

The upper space 210 is formed in the upper block 200 to be recessed upwardly from the bottom of the upper block 200. The ceiling 211 of the upper space 210 (the flow space 202) is inclined from the central portion towards the outer circumferential portion vertically downwardly. In the central portion of the ceiling 211, an exhaust port 212 is formed to evacuate the inside of the flow space 202. In addition, the outer edge of the ceiling 211 is downwardly recessed in a step shape, and solvent supply ports 213 are formed at, for example, two places on the outer edge to supply the solvent to the flow space 202.

A pipe joint 221 is provided on the top surface of the upper block 200, to connect an exhaust pipe 220 thereto. The exhaust pipe 220 communicates with the exhaust port 212 through the pipe joint 221. Since the ceiling 211 is inclined, bubbles in the solvent circulating in the flow space 202 are gathered in the central portion of the ceiling 211 and discharged from the exhaust pipe 220 through the exhaust port 212.

In addition, a plurality of (e.g., two (2)) pipe joints 222 are provided on the top surface of the upper block 200 to connect solvent supply pipes 135 thereto. The solvent supply pipes 135 communicate with the solvent supply ports 213 through the pipe joints 222. In addition, the solvent is supplied to the flow space 202 from the solvent supply pipes 135 though the solvent supply ports 213.

Figure 8:
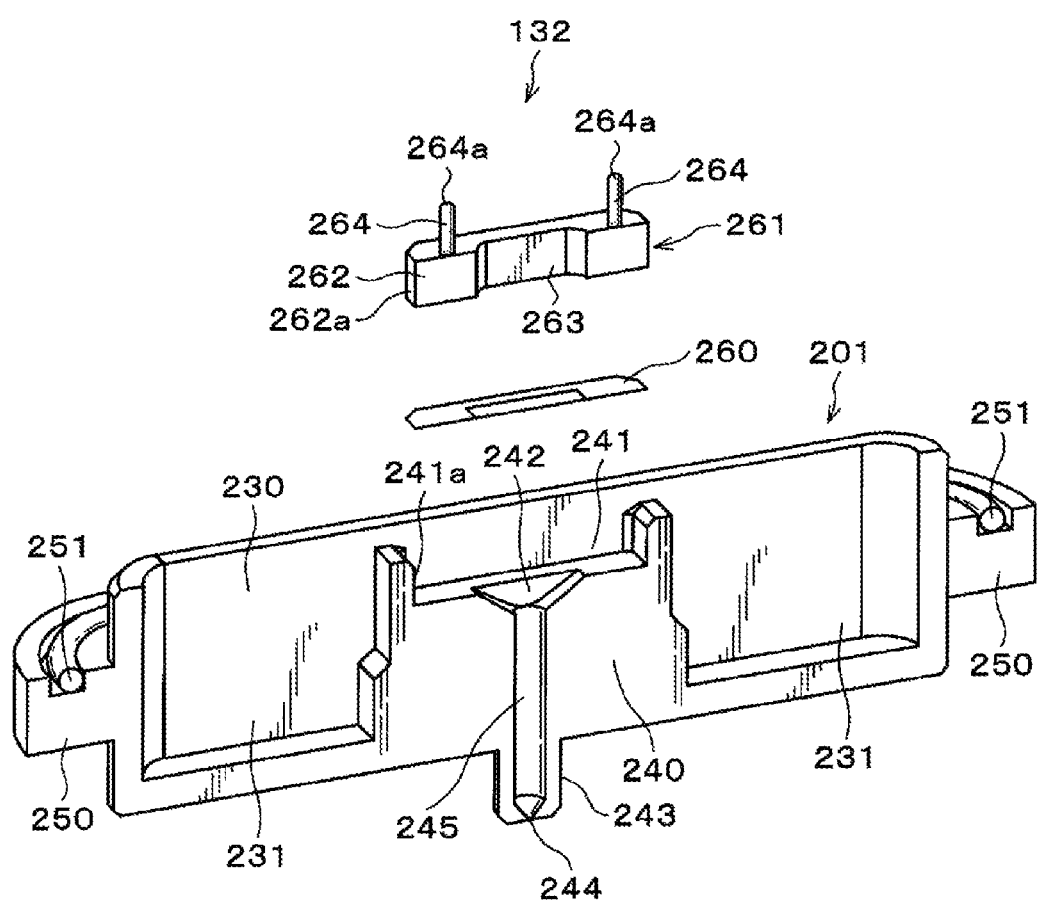
FIG. 8 is a vertically sectioned perspective view illustrating an outline of a lower block, a filter, and a fixing member in a state where the lower block, the filter and the fixing member are vertically cross-sectioned.

As illustrated in FIGS. 6 to 8, the lower block 201 has the lower space 230 which is recessed downwardly from the top surface thereof. As described above, the lower space 230 is joined with the upper space 210 in the upper block 200 to form the flow space 202. The lower space 230 (the flow space 202) includes a foreign matter collecting space 231 configured to collect foreign matters in the solvent by sedimenting the foreign matters. The foreign matter collecting space 231 is formed around a projection portion 240 to be lower than an inflow port 242 (the upper end of a circulating path 245). A specific design method of the foreign matter collecting space 231 will be described later.

In addition, a foreign matters discharge pipe (not illustrated) may be provided in the lower block 201 to discharge the foreign matters collected in the foreign matter collecting space 231.

In the lower block 201, the projection portion 240 is formed in the central portion of the lower space 230 to protrude from the bottom of the lower space 230. A recess 241 is formed on the top surface of the projection portion 240, and a filter 260 and a fixing member 261 as described below are disposed in the recess 241. The inflow port 242 is formed on the bottom of the recess 241 and the solvent is introduced into the flow space 202 through the inflow port 242. In addition, a nozzle 243 is formed on the lower block 201 to protrude downwardly from the central portion of the bottom of the nozzle 243. A solvent ejection port 244 is formed on the bottom of the nozzle 243. The ejection port 244 has a diameter of, for example, 0.1 mm or less. A solvent flow path 245 is formed in the projection portion 240 and the nozzle 243 to interconnect the inflow port 242 and the ejection port 244 and perforate the projection portion 240 and the nozzle 243 in the vertical direction. The upper portion of the flow path 245 has a taper shape, of which the diameter decreases from the inflow port 242.

An annular ring 250 is provided on the side surface of the lower block 201 to protrude outwardly from the side surface. The top surface of the ring 250 is in contact with the upper block 200 and an annular sealing material such as, for example, an O-ring made of a resin, is provided on the top surface.

The solvent nozzle 132 further includes a filter 260 configured to collect and remove foreign matters in the solvent and a fixing member 261 configured to fix the filter 260. The filter 260 and the fixing member 261 are disposed in the recess 241 of the lower block 201. Since the solvent passes through the filter 260 at a predetermined flowing speed, the filter may be moved (e.g., vibrated) when the fixing is loosened, and in such a case, foreign matters may occur due to the movement of the filter 260. Accordingly, it is necessary for the filter 260 to be properly fixed by the fixing member 261.

For example, a mesh plate, which is formed with a plurality of holes having a diameter of dozens of micrometers and has a thickness of dozens of micrometers, may be used as the filter 260. The diameter of the holes in the filter 260 may be optionally set depending on an estimated diameter of the foreign matters. The filter 260 is disposed to cover the inflow port 242 of the flow path 245.

The fixing member 261 has a body 262 which is made of a resin and fixes the filter 260 therebelow. A through hole 263 is formed in the central portion of the body 262 to allow the solvent to flow therethrough. In addition, the fixing member 261 includes a protrusion 264 protruding from the top surface of the body 262. Two protrusions 264 are formed around the through hole 263. The tip end 264a of each protrusion 264 has a semispherical shape. The tip end 264a may be approximately semispherical. For example, the tip end 264a may be rounded.

The protrusions 264 are in contact with the ceiling 211 of the upper space 210 (the flow space 202), and the fixing member 261 fixes the filter 260 in the vertical direction in cooperation with the projection portions 240. At this time, since the contact area between the protrusions 264 and the ceiling 211 is small, occurrence of foreign matters may be suppressed. When the tip ends of the protrusions 264 are flat and angled, foreign matters may occur as the tip ends may be cut while coming into contact with ceiling 211. However, the rounded tip ends 264a of the present exemplary embodiment are capable of suppressing the occurrence of the foreign matters. Further, since the ceiling 211 is inclined vertically downwardly towards the outer circumferential portion from the central portion, buckling of the protrusions 264 may be suppressed along the inclination of the ceiling 211. In addition, since the behavior of the protrusions 264 is stable, the filter 260 may be reliably fixed by the fixing member 261.

In addition, the fixing member 261 is disposed in the recess 241 to form a gap between the outer surface 262a of the body 262 illustrated in FIG. 8 and the inner surface 241a of the recess 241 of the projection portion 240. Thus, no foreign matter occurs when the fixing member 261 and the projection portion 240 slide.

Figure 9:
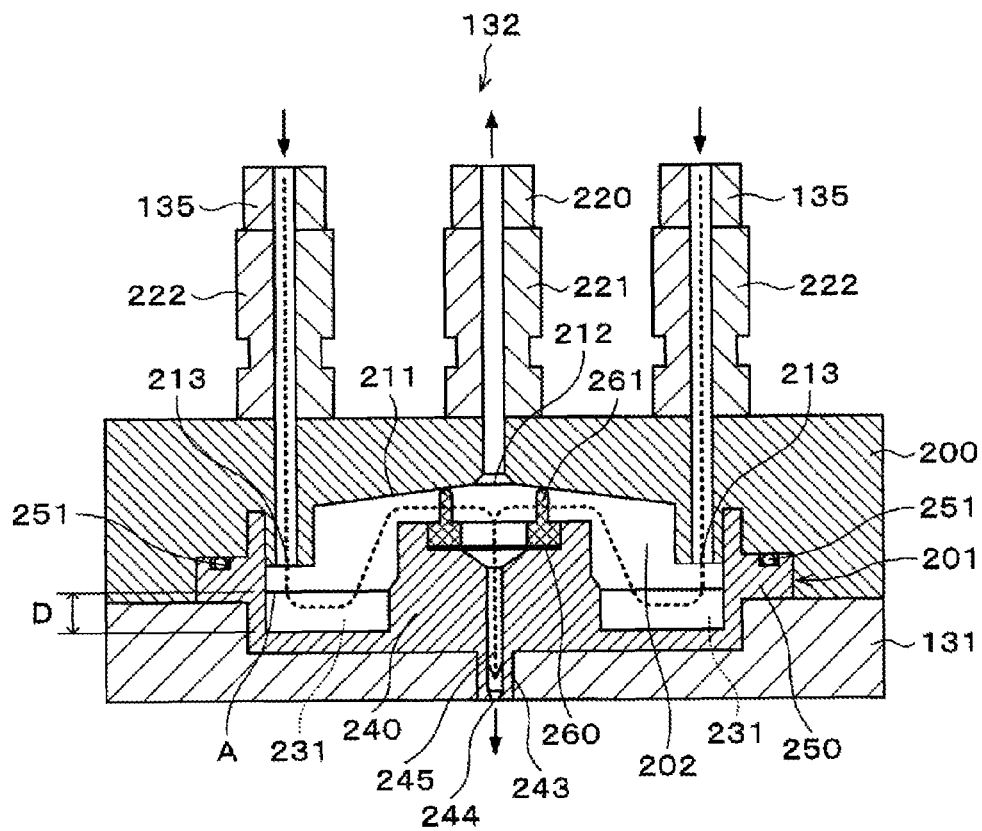
FIG. 9 is an explanatory view illustrating the flow of the solvent within the solvent nozzle.
Figure 10:
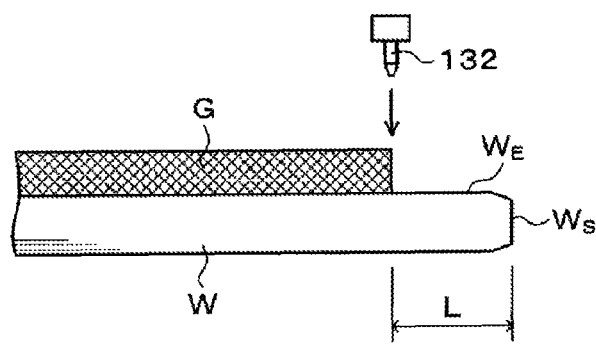
FIG. 10 is an explanatory view illustrating an aspect of removing the glue on the outer circumferential portion of a processing target wafer.

Next, descriptions will be made on a configuration of the foreign matter collecting space 231 described above. The foreign matter collecting space 231 is a space configured to sediment the foreign matters in the solvent flowing in the flow space 202. First, the flow of the solvent within the solvent nozzle 132 will be described. As illustrated in FIG. 9, the solvent supplied from the solvent supply pipe 135 to the flow space 202 flows up through the foreign matter collecting space 231, then, sequentially passes through the through hole 263 of the fixing member 261, the filter 260, the inflow port 242, and the flow path 245, and then is ejected from the ejection port 244 (in FIG. 9, the dotted line arrow indicates the flow route of the solvent).

The foreign matter collecting space 231 is formed such that the sedimentation speed of foreign matters in the foreign matter collecting space 231 is higher than the flowing speed of the solvent in the flow space 202. A parameter for causing the sedimentation speed of foreign matters to be higher than the flowing speed of the solvent is an outflow area A of the foreign matter collecting space 231 when the solvent flows out from the foreign matter collecting space 231. In the present exemplary embodiment, the outflow area A may also be referred to as the area of the foreign matter collecting space 231 in the plan view. The outflow area A is adjusted so as to cause the sedimentation speed of the foreign matters to be higher than the flowing speed of the solvent. Specifically, when the outflow area A is large, the flowing speed of the solvent flowing out from the foreign matter collecting space 231 is reduced so that the foreign mattes are sedimented more easily in the foreign matter collecting space 231.

Another parameter for causing the sedimentation speed of foreign matters to be higher than the flowing speed of the solvent is a depth D of the foreign matter collecting space 231. For example, when the depth D of the foreign matter collecting space 231 is shallow, the solvent supplied from the solvent supply pipe 135 to the flow space 202 may impinge against the bottom surface of the lower block 201 (the bottom surface of the foreign matter collecting space 231). In such a case, the flow of the solvent in the foreign matter collecting space 231 is disturbed such that the foreign matters cannot be properly sedimented. Accordingly, it is necessary to secure the depth D of the foreign matter collecting space 231 in order to cause the sedimentation speed of foreign matters higher than the flowing speed of the solvent without disturbing the flow of the solvent within the foreign matter collecting space 231.

In addition, it is also effective to supply the solvent to the flow space 202 from a plurality of solvent supply ports 231 in order to cause the sedimentation speed of foreign matters to be higher than the flowing speed of the solvent. In such a case, the flowing speed of the solvent in the flow space 202 may be reduced when the solvent is dispersed and supplied to the flow space 202. Then, the foreign matters may be easily sedimented in the foreign matter collecting space 231.

For example, the shape of the foreign matter collecting space 231 may be optimized by performing, for example, a simulation or a test. In other words, when a condition, in which the sedimentation speed of foreign matters is higher than the flowing speed of the solvent without disturbing the flow of the solvent flowing out from the foreign matter collecting space 231, is satisfied, the shape of the foreign matter collecting space 231, or the number, arrangement or shape of the solvent supply ports 213 (the number, arrangement or shape of the solvent supply pipes 135) may be optionally designed.

That is, the shape of the foreign matter collecting space 231 is not limited to the present exemplary embodiment. In addition, the number of the solvent supply ports 213 (the number of the solvent supply pipes 135) is not limited to the present exemplary embodiment, as well, and may be one, or three or more. The solvent supply ports 213 are formed on the top surface of the flow space 202. Without being limited thereto, however, the solvent supply ports 213 may be supplied on the side surface of the flow space 202 so that the solvent is supplied from the lateral side of the flow space 202. Furthermore, the diameter of the solvent supply ports 213 may be set to be smaller than that of the solvent supply pipes 135 so that the speed of the solvent supplied to the flow space 202 is reduced.

In addition, according to a simulation performed by the inventors using the solvent nozzle 132 of the present exemplary embodiment, foreign matters having a diameter of 80 µm or more were removed in the foreign matter collecting space 231.

Next, descriptions will be made on a bonding method of a processing target wafer W and a support wafer S which is performed using the bonding system 1 configured as described above.

First, a cassette $C_W$ that accommodates a plurality of processing target wafers W, a cassette $C_S$ that accommodates a plurality of support wafers S, and an empty cassette $C_T$ are respectively mounted on predetermined cassette mounting plates 11 of the carry-in/out station 2. Then, a processing target wafer W within the cassette $C_W$ is taken out by the wafer conveyance apparatus 22 and conveyed to the transition apparatus 50 of the third processing block G3 of the processing station 3. At this time, the processing target wafer W is conveyed in a state where its non-bonded surface $W_N$ is oriented downward.

Next, the processing target wafer W is conveyed to the coating processing apparatus 40 by the wafer conveyance apparatus 61. The processing target wafer W carried into the coating processing apparatus 40 is delivered to the spin chuck 110 from the wafer conveyance apparatus 61 and attracted to and held by the spin chuck 110. At this time, the non-bonded surface $W_N$ of the processing target wafer W is attracted to and held by the spin chuck 110.

Subsequently, the glue nozzle 122 in the standby unit 124 is moved to a position above the central portion of the processing target wafer W by the arm 121. Then, the glue G is supplied to the bonded surface $W_J$ of the processing target wafer W from the glue nozzle 122 while the processing target wafer W is rotated by the spin chuck 110. The supplied glue G is spread over the entire bonded surface $W_J$ of the processing target wafer W by a centrifugal force so that the glue G is coated on the bonded surface $W_J$ of the processing target wafer W.

Then, the glue nozzle 122 is moved to the standby unit 124 and the solvent nozzle 132 of the standby unit 134 is moved to a position above the outer circumferential portion of the processing target wafer W by the arm 131. At this time, the solvent nozzle 132 is located at a predetermined distance L (e.g., 5 mm to 7.5 mm) from the outer side surface $W_S$ of the processing target wafer W. The distance L is determined by the control unit 70 based on, for example, the kind of the glue G, the target film thickness of the glue G coated on the processing target wafer W, a heat treatment temperature of the processing target wafer W, or a pressure for comprising the processing target wafer W and the support substrate.

Thereafter, a solvent of the glue G is supplied to the outer circumferential portion $W_E$ of the processing target wafer W from the solvent nozzle 132 while the processing target wafer W is rotated by the spin chuck 110. The supplied solvent of the glue G flows on the outer circumferential portion $W_E$ of the processing target wafer W towards the outer side surface $W_S$ by the centrifugal force. By this glue G, the glue G on the outer circumferential portion $W_E$ of the processing target wafer W is removed.

At this time, as illustrated in FIG. 9, in the solvent nozzle 132, the solvent is supplied to the flow space 202 from the supply pipes 135, and foreign matters in the solvent are sedimented and collected in the foreign matter collecting space 231. In addition, when the solvent flows into the flow path 245 from the flow space 202, the foreign matters in the solvent are collected by the filter 260. The solvent, from which the foreign matters have been removed, is ejected from the ejection port 244. In such a case, since the foreign matters in the solvent are collected in two steps by the foreign matter collecting space 231 and the filter 260, the foreign matters may be reliably removed. Thus, blockage of the solvent nozzle 132 can be suppressed.

Next, the processing target wafer W is conveyed to the heat treatment apparatus 41 by the wafer conveyance apparatus 61. In the heat treatment apparatus 41, the processing target wafer W is heated to, for example, 100° C. to 300° C., by the heating unit. When the heating is performed, the glue G on the processing target wafer W is heated and cured. Then, the temperature of the processing target wafer W is adjusted to a predetermined temperature by the temperature adjusting unit.

Next, the processing target wafer W is conveyed to the bonding apparatus 30 by the wafer conveyance apparatus 61. In the bonding apparatus 30, the processing target wafer W is held on the first holding unit in the bonding unit in the state where the bonded surface $W_J$ of the processing target wafer W is oriented upward, that is, the glue G is oriented upward.

While the processing in the coating processing apparatus 40, the processing in the heat treatment apparatus 41, and the processing in the bonding apparatus 30 as described above are performed on the processing target wafer W, a processing on a support wafer S is performed subsequent to the processing target wafer W. The support wafer S is conveyed to the bonding apparatus 30 by the wafer conveyance apparatus 61. In the bonding apparatus 30, the front and rear surfaces of the support wafer S are inverted by the inverting unit. That is, the bonded surface $S_J$ of the support wafer S is oriented downward. Then, the support wafer S is held on the second holding unit in the bonding unit in the state where the bonded surface $S_J$ of the support wafer S is oriented downward.

When the processing target wafer W and the support wafer S are respectively held on the first holding unit and the second holding unit in the bonding apparatus 30, the horizontal positions and the vertical positions of the processing target wafer W and the support wafer S are adjusted, then the bonded surface $W_J$ of the processing target wafer W and the bonded surface $S_J$ of the support wafer S are brought into contact with each other, and the processing target wafer W and the support wafer S are bonded to each other by the glue G. In addition, when the processing target wafer W and the support wafer S are heated to a predetermined temperature, for example, 200° C. and pressed, the processing target wafer W and the support wafer S may be more firmly affixed and bonded to each other.

Next, the superposed wafer T including the processing target wafer W and the support wafer S which have been bonded to each other is conveyed to the heat treatment apparatus 42 by the wafer conveyance apparatus 61. In addition, the temperature of the superposed wafer T is adjusted to a predetermined temperature, for example, room temperature (23° C.) in the heat treatment apparatus 42. Then, the superposed wafer T is conveyed to the transition apparatus 51 of the wafer conveyance apparatus 61, and then conveyed to a cassette $C_T$ of a predetermined cassette mounting plate 11 by the wafer conveyance apparatus 22 in the carry-in/out station 2. In this way, a series of bonding processes of the processing target wafer W and the support wafer S are finished.

According to the exemplary embodiment described above, since the foreign matter collecting space 231 and the filter 260 are provided within the solvent nozzle 132, foreign matters in the solvent can be removed just before the solvent is supplied to the processing target wafer W from the solvent nozzle 132. That is, the foreign matters may be removed regardless the occurrence source thereof. Further, since the foreign matters are collected in two steps by the foreign matter collecting space 231 and the filter 260 as described above, the foreign matters can be reliably removed. Accordingly, even when the diameter of the ejection port 244 is small as in the present exemplary embodiment, blockage of the solvent nozzle 132 can be suppressed and the solvent can be properly supplied to the processing target wafer W from the solvent nozzle 132. Further, since the solvent which does not contain foreign matters can be supplied to the processing target wafer W, the glue G on the outer circumferential portion $W_E$ of the processing target wafer W can be properly removed.

In addition, the fixing member 261 of the filter 260 fixes the filter 260 when the protrusions 264 are in contact with the ceiling 211 of the flow space 202. The tip ends 264*a* of the protrusions 264, each having a semispherical shape, are not cut even though the tip ends 264*a* come in contact with the ceiling 211. Accordingly, in fixing the filter 260, since the protrusions 264 are in contact with the ceiling 211 with a small area, and further, the tip ends 264*a* are not cut by the contact, occurrence of foreign matters can be suppressed. Thus, blockage of the solvent nozzle 132 can be more reliably suppressed.

In addition, since the ceiling 211 of the flow space 202 is inclined vertically downwardly from the central portion towards the outer circumferential portion, buckling of the protrusions 264 of the fixing member 261 can be suppressed along the inclination of the ceiling 211. Accordingly, the filter 260 can be properly fixed by the fixing member 261.

In addition, the foreign matter collecting space 231 is formed such that the sedimentation speed of foreign matters in the foreign matter collecting space 231 is higher than the flowing speed of the solvent in the flow space 202 by adjusting the outflow material A or the depth D of the foreign matter collecting space 231. Furthermore, when a plurality of solvent supply pipes 135 are provided, the solvent is dispersed and supplied to the flow space 202 and as a result, the flowing speed of the solvent in the flow space 202 can be reduced. Accordingly, the foreign matters can be properly sedimented and collected in the foreign matter collecting space 231.

In the solvent nozzle 132 of the exemplary embodiment described above, the configuration of the fixing member 261 that fixes the filter 260 is not limited to the present exemplary embodiment. For example, the filter 260 may be fixed using a magnet. An exemplary embodiment using the magnet will be described with reference to FIGS. 11 to 14.

Figure 11:
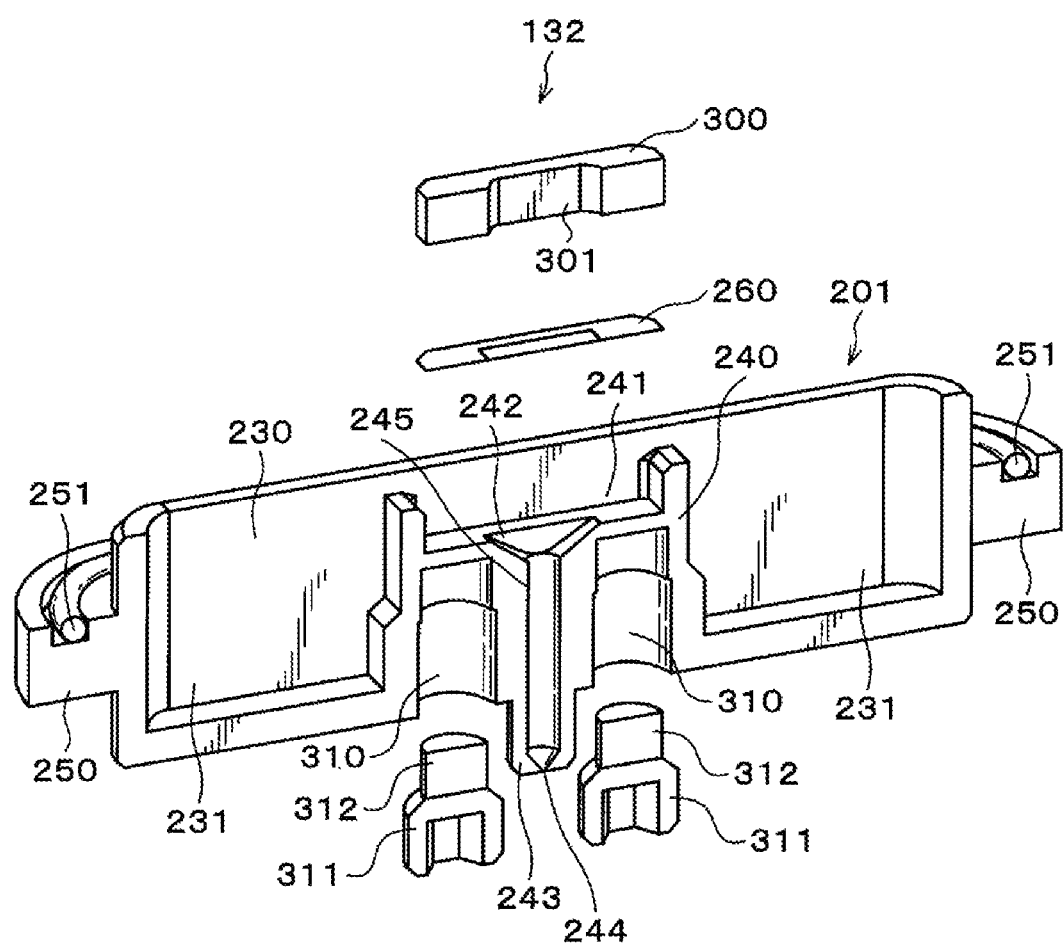
FIG. 11 is a vertically sectioned perspective view illustrating an outline of a configuration of a lower block, a filter, and a fixing member according to another exemplary embodiment.

As illustrated in FIG. 11, a solvent nozzle 132 includes a fixing member 300 in place of the fixing member 261 of the exemplary embodiment described above. The fixing member 300 is made of a magnetic material such as, for example, a metal. In addition, a through hole 301 is formed in the central portion of the fixing member 300 to allow the solvent to flow therethrough.

Holes 310 are formed in the projection portion 240 of the lower block 201 at, for example, two locations outside the flow path 245. A magnet 312 supported by a support member 311 is fitted in each hole 310. Since other components of the solvent nozzle 132 are the same as those of the solvent nozzle 132 of the exemplary embodiment described above, descriptions thereof will be omitted.

In this case, the fixing member 300 is attracted to the magnets 312 and the filter 260 is fixed by the fixing member 300 in a state where the fixing member 300 and the filter 260 are disposed in the recess 241 of the projection portion 240. That is, the fixing member 300 fixes the filter 260 in a contactless state where the fixing member 300 is not in contact with, for example, the ceiling 211 of the flow space 202. Accordingly, occurrence of foreign matters when fixing the filter 260 can be more reliably suppressed.

In addition, when the magnets 312 are removed, the fixing member 300 and the filter 260 can be easily removed, and maintenance of the solvent nozzle 132 can be easily performed.

Figure 12:
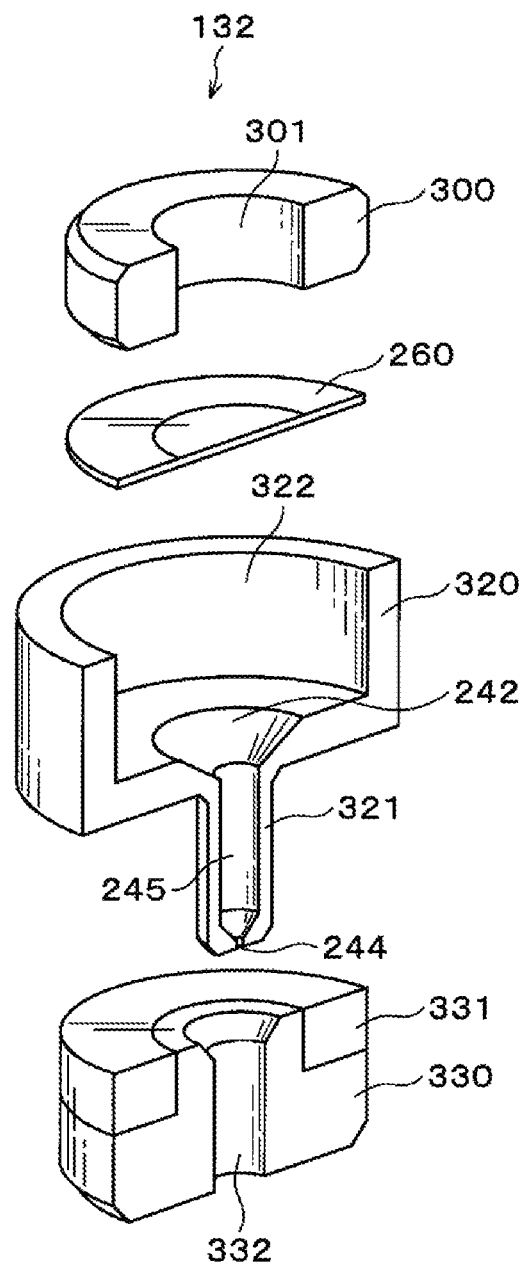
FIG. 12 is a vertically sectioned perspective view illustrating an outline of a configuration of a lower block, a filter, and a fixing member according to another exemplary embodiment.
Figure 13:
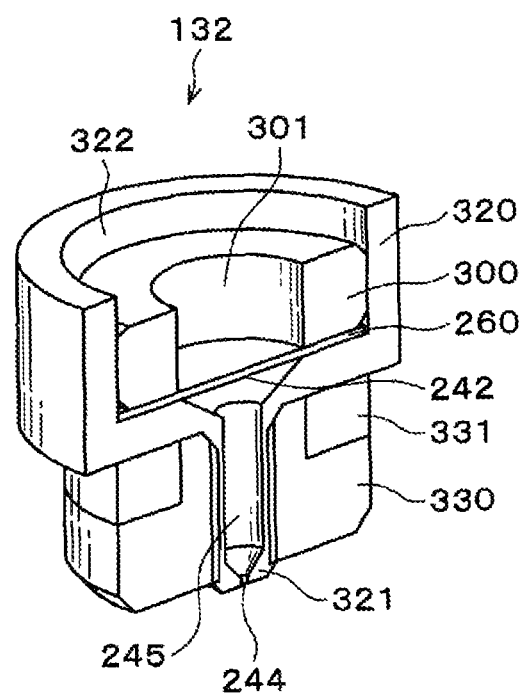
FIG. 13 is a vertically sectioned perspective view illustrating an outline of a configuration of a lower block, a filter, and a fixing member according to another exemplary embodiment.

As illustrated in FIGS. 12 and 13, the solvent nozzle 132 includes a holding part 320 and a nozzle 321 in place of the projection portion 240 and the nozzle 243 of the exemplary embodiment described above. A recess 322 is formed in the holding part 320 and the filter 260 and the fixing member 300 are disposed in the recess 322. In addition, the fixing member 300 is made of a magnetic material as in the example illustrated in FIG. 11. In addition, in the example of FIGS. 12 and 13, the filter 260 and the fixing member 300 have a substantially circular shape when viewed in a plan view. Without being limited thereto, however, the plan shape may be substantially rectangular shape as in the exemplary embodiment described above.

The nozzle 321 is elongated vertically downwardly from the holding part 320. A solvent flow path 245 which is the same as that of the exemplary embodiment described above is formed in the inside of the nozzle 321. An inflow port 242 is formed on the upper end of the flow path 245 (the bottom of the recess 322), and an ejection port 244 is formed on the lower end of the flow path 245.

The magnet 331 supported by the support member 330 is provided outside the nozzle 321. A through hole 332 is formed in the central portion of the support member 330, and the nozzle 321 is fitted in the through hole 332. The other components of the solvent nozzle 132 are the same as those of the solvent nozzle 132 of the exemplary embodiment described above and thus descriptions thereof will be omitted.

In such a case, the fixing member 300 is attracted to the magnet 331 and the filter 260 is fixed by the fixing member 300 in the state where the fixing member 300 and the filter 260 are disposed in the recess 322 of the holding part 320. That is, the fixing member 300 fixes the filter 260 in a contactless state. Accordingly, occurrence of foreign matters when fixing the filter 260 can be suppressed more reliably.

In addition, the magnet 331, which is embedded in the support member 330, is simple in configuration. Thus, the solvent nozzle 132 may be easily manufactured and further the quality of the solvent nozzle 132 may also be stabilized.

Figure 14:
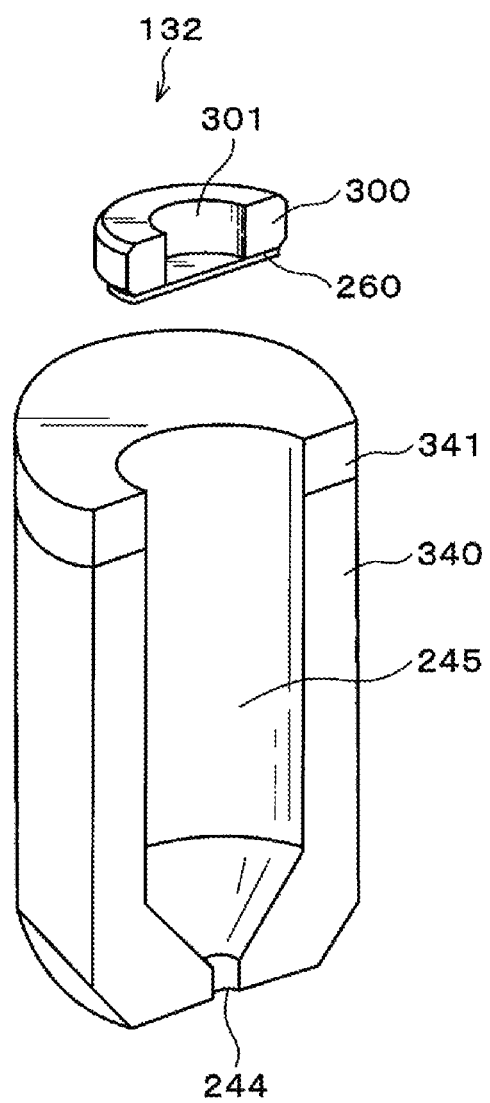
FIG. 14 is a vertically sectioned perspective view illustrating an outline of a configuration of a lower block, a filter, and a fixing member according to another exemplary embodiment.

In the exemplary embodiment described above, the filter 260 is installed above the flow path 245. However, as illustrated in FIG. 14, the filter 260 may be installed within the flow path 245. The solvent nozzle 132 includes a nozzle 340 in place of the nozzle 321 of the exemplary embodiment described above. A solvent flow path 245 is formed inside the nozzle 340, and the nozzle 340 includes a magnet 341 that surrounds the flow path 245. In addition, the filter 260 and the fixing member 300 made of a magnetic material are integrally constituted and disposed within the flow path 245. The other components of the solvent nozzle 132 are the same as those of the solvent nozzle 132 of the embodiment described above and thus, descriptions thereof will be omitted.

In such a case, the fixing member 300 is attracted to the magnet 341 and the filter 260 is fixed in the state where the fixing member 300 and the filter 260 are disposed within the flow path 245. That is, the fixing member 300 fixes the filter 260 in a contactless state where the fixing member 300 is not in contact with the side surface of the flow path 245. Accordingly, occurrence of foreign matters when fixing the filter 260 can be more reliably suppressed.

The solvent nozzle 132 of the exemplary embodiment described above has a foreign matter collecting space 231 provided therein. However, the foreign matter collecting space 231 may be omitted. That is, removal of the foreign matters in the solvent may be performed only by the filter 260.

Figure 15:
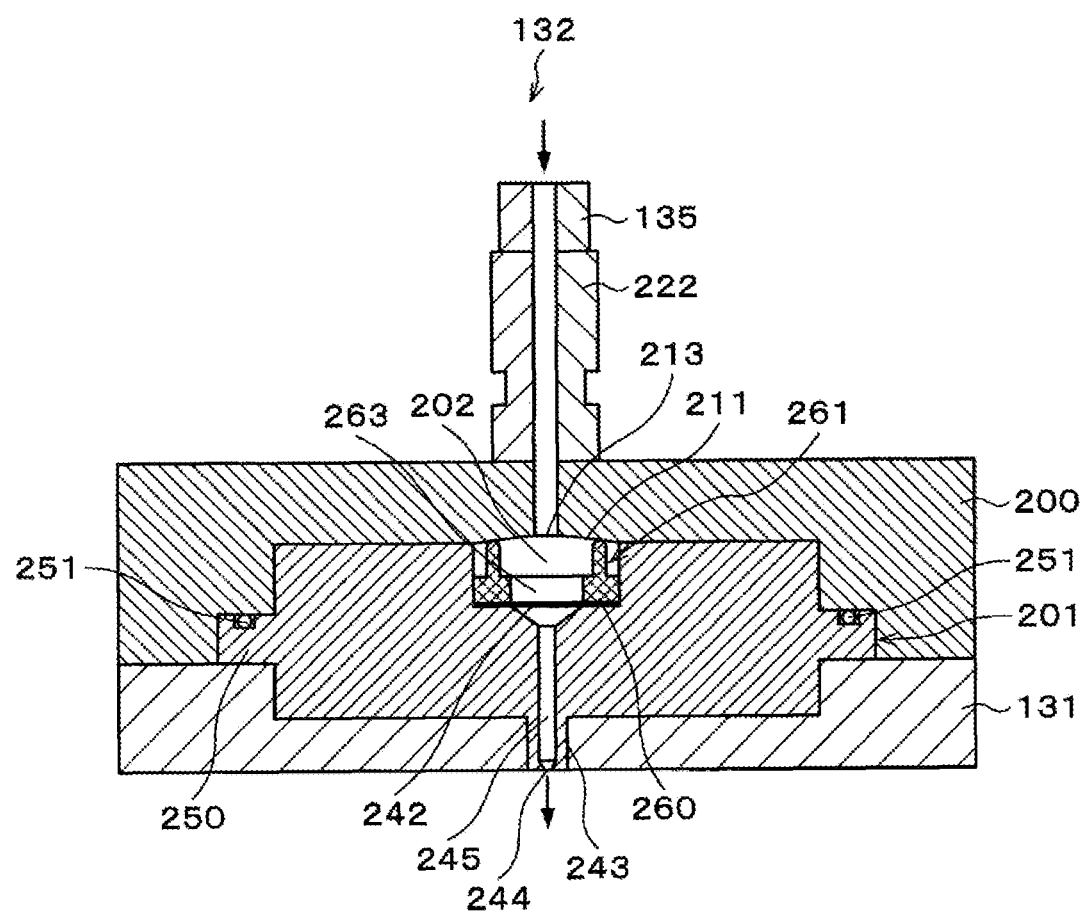
FIG. 15 is a vertically sectioned perspective view illustrating an outline of a configuration of a solvent nozzle according to another exemplary embodiment.

As illustrated in FIG. 15, the flow space 202 of the solvent nozzle 132 is formed only above the fixing member 261 and the foreign matter collecting space 231 is omitted. In addition, only one solvent supply port 213 supplying the solvent to the flow space 202 is formed at one location in the central portion of the ceiling 211 of the flow space 202. Thus, one solvent supply pipe 135 is provided to be connected with the upper block 200. In addition, the other components of the solvent nozzle 132 are the same as those of the exemplary embodiment described above, and thus descriptions thereof will be omitted.

In such a case, the solvent supplied to the flow space 202 from the solvent supply pipe 135 sequentially passes through the flow space 202, the through hole 263 of the fixing member 261, the filter 260, the inflow port 242, and the flow path 245 to be ejected from the ejection port 244. In addition, when the solvent passes through the filter 260, the foreign matters in the solvent are collected and removed. Accordingly, blockage of the solvent nozzle 132 can be suppressed, and the solvent can be properly supplied from the solvent nozzle 132 to a processing target wafer W.

Here, when the foreign matter collecting space 231 is formed in the solvent nozzle 132 as in the exemplary embodiment described above, the foreign matters may be collected in two steps by the foreign matter collecting space 231 and the filter 260. Thus, the foreign matter removal performance is enhanced. Whereas, when the foreign matter collecting space 231 is not formed in the solvent nozzle 132 as in the present exemplary embodiment, the foreign matters are removed only by the filter 260. However, since the configuration of the solvent nozzle 132 may be simplified, the solvent nozzle 132 can be easily manufactured and the quality thereof can be stabilized. Accordingly, existence/non-existence of the foreign matter collecting space 231 may be selected depending on a requested foreign matter removal performance.

In the example illustrated in FIG. 15, the filter 260 may also be fixed using a magnet as illustrated in FIGS. 11 to 14, in place of the fixing member 261.

In the exemplary embodiments described above, a processing target wafer W and a support wafer S are bonded to each other in the state where the processing target wafer W is disposed at the lower side and the support wafer S is disposed at the upper side. However, the upper and lower arrangement of the processing target wafer W and the support wafer S may be reversed. In such a case, the glue G is coated on the bonded surface $S_J$ of the support wafer S and the front and rear surfaces of the processing target wafer W are inverted. Then, the support wafer S and the processing target wafer W are bonded to each other. However, from a viewpoint of protecting, for example, an electronic circuit on the processing target wafer W, it is preferable that the glue G is coated on the processing target wafer W.

In the exemplary embodiments described above, the glue G is coated on any one of the processing target wafer W and the support wafer S in the coating processing apparatus 40. However, the glue G may be coated on both the processing target wafer W and the support wafer S.

In the exemplary embodiments described above, descriptions have been made on a case where the processing liquid nozzle of the present disclosure is used as a solvent nozzle 132 in the coating processing apparatus 40. However, the processing liquid nozzle of the present disclosure may be applied to other processings. For example, when a resist liquid is coated on a wafer in a photography processing, the processing liquid nozzle of the present disclosure may also be applied to an edge bead remover (EBR) nozzle that cleans outer circumferential portion of the wafer. In addition, the processing liquid nozzle of the present disclosure may also be applied to a nozzle that coats another coating liquid on a wafer. Furthermore, the present disclosure may also be applied to a case where the substrate is a substrate other than a wafer such as, for example, a flat panel display (FPD) or a mask reticle for photomask.

However, in a bonding processing of a processing target wafer W and a support wafer S through glue G as in the exemplary embodiments described above, accuracy requested when removing the glue G on the outer circumferential portion of the processing target wafer W by the solvent nozzle 132 is extremely high. Accordingly, the present disclosure becomes especially useful when it is important to properly supply the solvent from the solvent nozzle 132 to the processing target wafer W, and the solvent nozzle 132 is used as the processing liquid nozzle.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A processing liquid nozzle that supplies a processing liquid to a substrate, the processing liquid nozzle comprising:
   a hollow nozzle body;
   a processing liquid flow space formed inside the nozzle body;

a projection portion formed in a central portion of the processing liquid flow space to protrude from a bottom of the processing liquid flow space; and a processing liquid flow path configured to connect a processing liquid ejection port formed in a lower portion of the nozzle body and the processing liquid flow space with each other, the processing liquid flow path being formed in the projection portion to perforate the projection portion and the processing liquid ejection port in a vertical direction, wherein the processing liquid flow space includes a foreign matter collecting space which is formed around the projection portion to be lower than an upper end of the processing liquid flow path so as to sediment and collect foreign matters in the processing liquid.

2. The processing liquid nozzle of claim 1, wherein the foreign matter collecting space is formed to cause a sedimentation speed of the foreign matters in the foreign matter collecting space to be higher than a flow speed of the processing liquid in the processing liquid flow space.

3. The processing liquid nozzle of claim 2, wherein an outflow area of the processing liquid in the foreign matter collecting space is determined such that the sedimentation speed is higher than the flow speed.

4. The processing liquid nozzle of claim 2, wherein a depth in the foreign matter collecting space is determined such that the sedimentation speed is higher than the flow speed.

5. The processing liquid nozzle of claim 1, wherein the nozzle body is provided with a plurality of processing liquid supply pipes which are configured to supply the processing liquid to the processing liquid flow space.

6. The processing liquid nozzle of claim 1, wherein the nozzle body is provided with an exhaust pipe which is formed in a ceiling of the processing liquid flow space so as to discharge bubbles in the processing liquid circulating in the processing liquid flow space.

7. A processing liquid nozzle that supplies a processing liquid to a substrate, the processing liquid nozzle comprising:
a hollow nozzle body;
a processing liquid flow space formed inside the nozzle body;
a projection portion formed in a central portion of the processing liquid flow space to protrude from a bottom of the processing liquid flow space;
a processing liquid flow path configured to connect a processing liquid ejection port formed in a lower portion of the nozzle body and the processing liquid flow space with each other, the processing liquid flow path being formed in the projection portion to perforate the projection portion and the processing liquid ejection port in a vertical direction;
a filter provided above the processing liquid flow path so as to collect and remove foreign matters in the processing liquid; and
a fixing member configured to fix the filter in the vertical direction in corporation with the nozzle body,
wherein the fixing member includes:
a body configured to fix the filter on a bottom side of the filter; and
a protrusion protruding from a top end of the body to be in contact with a ceiling of the processing liquid flow space, and
the processing liquid flow space includes a foreign matter collecting space which is formed around the projection portion to be lower than an upper end of the processing liquid flow path so as to sediment and collect foreign matters in the processing liquid.

8. The processing liquid nozzle of claim 7, wherein the foreign matter collecting space is formed to cause a sedimentation speed of the foreign matters in the foreign matter collecting space to be higher than a flow speed of the processing liquid in the processing liquid flow space.

9. The processing liquid nozzle of claim 8, wherein an outflow area of the processing liquid in the foreign matter collecting space is determined such that the sedimentation speed is higher than the flow speed.

10. The processing liquid nozzle of claim 8, wherein a depth in the foreign matter collecting space is determined such that the sedimentation speed is higher than the flow speed.

11. The processing liquid nozzle of claim 7, wherein the nozzle body is provided with a plurality of processing liquid supply pipes which are configured to supply the processing liquid to the processing liquid flow space.

12. The processing liquid nozzle of claim 7, wherein the nozzle body is provided with an exhaust pipe which is formed in a ceiling of the processing liquid flow space so as to discharge bubbles in the processing liquid circulating in the processing liquid flow space.

13. The processing liquid nozzle of claim 7, wherein the ceiling of the processing liquid flow space is inclined vertically downwardly from a central portion towards an outer circumferential portion.

14. The processing liquid nozzle of claim 7, wherein the protrusion has a tip end formed in a semispherical shape.

15. A processing liquid nozzle that supplies a processing liquid to a substrate, the processing liquid nozzle comprising:
a hollow nozzle body;
a processing liquid flow space formed inside the nozzle body;
a projection portion formed in a central portion of the processing liquid flow space to protrude from a bottom of the processing liquid flow space;
a processing liquid flow path configured to connect a processing liquid ejection port formed in a lower portion of the nozzle body and the processing liquid flow space with each other, the processing liquid flow path being formed in the projection portion to perforate the projection portion and the processing liquid ejection port in a vertical direction;
a filter provided above the processing liquid flow path so as to collect and remove foreign matters in the processing liquid;
a fixing member configured to fix the filter in the vertical direction in corporation with the nozzle body, the fixing member including a magnetic material; and
a magnet configured to attract the fixing member with the filter being sandwiched therebetween,
wherein the processing liquid flow space includes a foreign matter collecting space which is formed around the projection portion to be lower than an upper end of the processing liquid flow path so as to sediment and collect foreign matters in the processing liquid.

16. The processing liquid nozzle of claim 15, wherein the magnet is disposed outside the processing liquid flow path.

17. The processing liquid nozzle of claim 15, wherein each of the filter and the fixing member is disposed above the processing liquid flow path.

18. The processing liquid nozzle of claim 15, wherein each of the filter and the fixing member is disposed inside the processing liquid flow path.

\* \* \* \* \*